(12) United States Patent
Nagata

(10) Patent No.: US 10,937,899 B1
(45) Date of Patent: Mar. 2, 2021

(54) SEMICONDUCTOR DEVICE

(71) Applicant: RENESAS ELECTRONICS CORPORATION, Tokyo (JP)

(72) Inventor: Nao Nagata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/785,007

(22) Filed: Feb. 7, 2020

(51) Int. Cl.
*H01L 29/739* (2006.01)
*H01L 29/10* (2006.01)

(52) U.S. Cl.
CPC ...... *H01L 29/7397* (2013.01); *H01L 29/1095* (2013.01)

(58) Field of Classification Search
None
See application file for complete search history.

(56) References Cited

U.S. PATENT DOCUMENTS

| | | | |
|---|---|---|---|
| 2011/0012195 A1* | 1/2011 | Momota | H01L 29/7815 257/334 |
| 2013/0328105 A1 | 12/2013 | Matsuura | |
| 2015/0380538 A1* | 12/2015 | Ogawa | H01L 29/407 257/144 |
| 2016/0359026 A1* | 12/2016 | Matsuura | H01L 29/0619 |
| 2019/0006496 A1* | 1/2019 | Kanda | H01L 29/0623 |
| 2019/0181254 A1 | 6/2019 | Nagata | |

FOREIGN PATENT DOCUMENTS

| | | |
|---|---|---|
| JP | 2013-258190 A | 12/2013 |
| JP | 2019-102759 A | 6/2019 |

* cited by examiner

*Primary Examiner* — Thien F Tran
(74) *Attorney, Agent, or Firm* — McDermott Will & Emery LLP

(57) ABSTRACT

A semiconductor device include a semiconductor substrate, a first trench electrode formed in the semiconductor substrate and having a first portion, a second trench electrode formed in the semiconductor substrate having a second portion facing the first portion, a floating layer of a first conductivity type formed around the first and second trench electrodes, a drift layer of a second conductivity type connected to the floating layer of the first conductivity type and formed between the first and second trench electrodes, an impurity layer of the first conductivity type connected to the drift layer of the second conductivity type and formed between the first and second trench electrodes, and a floating layer control gate having a portion located at least above the impurity layer of the first conductivity type.

12 Claims, 24 Drawing Sheets

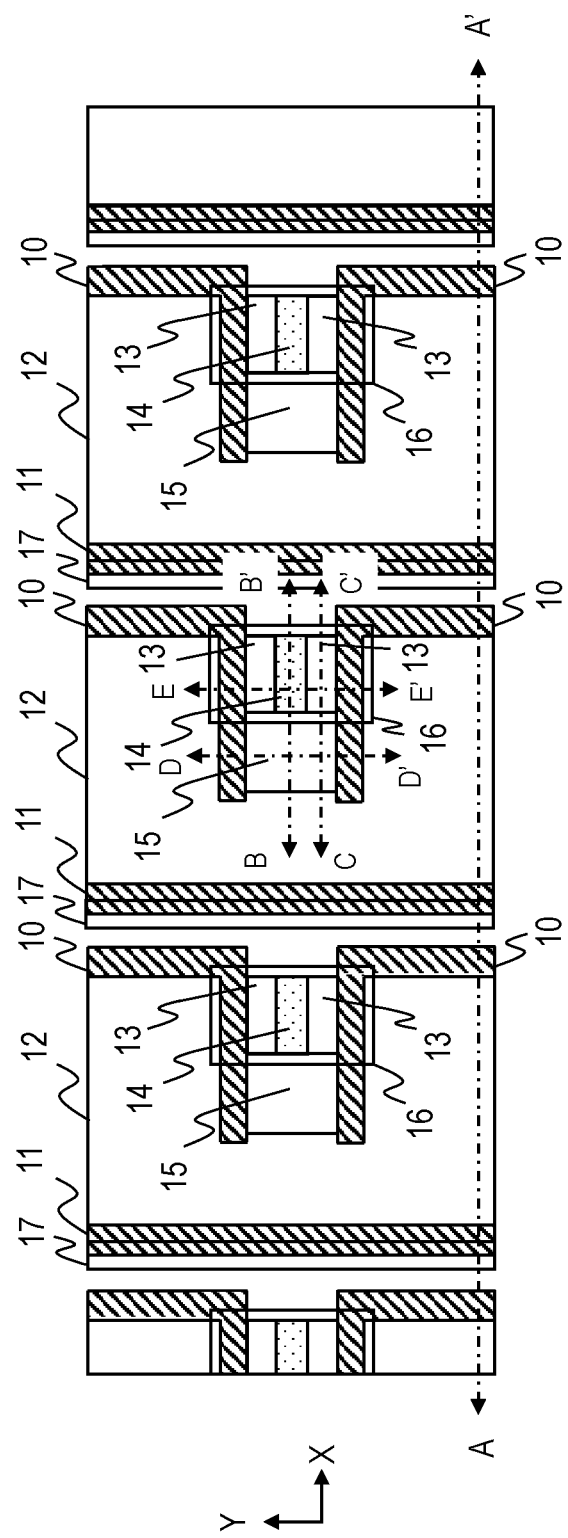

SEMICONDUCTOR DEVICE

BACKGROUND

It relates to a semiconductor device and its manufacturing method, and more particularly to a semiconductor device with an insulated-gate bipolar transistor (IGBT: Insulated Gate Bipolar Transistor).

Trench-gate IGBT is widely used as IGBT with low on-resistance, i.e., IGBT with low forward saturating voltage Vce(sat). In order to reduce the on-state conduction resistors and on-voltage of the trench-gate IGBT, an IE-type IGBT utilizing the IE (Injection Enhancement) effects has been developed. In the IE-type IGBT, active cells and inactive cells (also referred to as floating layers) are alternately arranged. By providing the floating layer, holes are less likely to be discharged from the emitter electrodes when IGBT is in the on-state, and the concentration of carriers (holes) accumulated in the drift layer can be increased.

Patent Document 1 discloses an IGBT structure in which active cell regions and inactive cell regions are alternately arranged in the X-axis direction. In the active cell region, an active section provided with an emitter region and an inactive section provided with a body contact portion are arranged. This configuration makes it possible to reduce the discharge path of carriers (holes) and to improve switching losses when IGBT is turned on.

Patent Document 2 discloses an IGBT in which the active cell regions and the inactive cell regions are alternately arranged in the X-axis directions. In the active cell region, a hybrid cell region having a body contact, an n-type isolation region, and a floating region having no body contact are arranged in the Y-axis direction. This configuration makes it possible to reduce the discharge path of carriers (holes) and to improve switching losses when IGBT is turned on.

PRIOR-ART DOCUMENT

Patent Document

[Patent Document 1] Japanese Unexamined Publication Laid-Open No. 2013-258190
[Patent Document 2] Japanese Unexamined Publication Laid-Open No. 2019-102759

SUMMARY

The arts described in Patent Document 1 and 2 allow for enhanced IE-effects, i.e., carrier (hole) storage capabilities. However, as the carrier accumulation quantity increases, the switching loss (Eoff) at the time of turn-off increases. It is required to achieve both the improvement of the IE effect and the reduction of Eoff.

Other objects and novel features will become apparent from the description of the specification and drawings.

A semiconductor device include a semiconductor substrate, a first trench electrode formed in the semiconductor substrate and having a first portion, a second trench electrode formed in the semiconductor substrate having a second portion facing the first portion, a floating layer of a first conductivity type formed around the first and second trench electrodes, a drift layer of a second conductivity type connected to the floating layer of the first conductivity type and formed between the first and second trench electrodes, an impurity layer of the first conductivity type connected to the drift layer of the second conductivity type and formed between the first and second trench electrodes, and a floating layer control gate having a portion located at least above the impurity layer of the first conductivity type.

In one embodiment, in IGBT, a semiconductor chip achieves both IE-effect improvement and switching loss at turn-off (Eoff) reduce.

BRIEF DESCRIPTION OF THE DRAWINGS

FIG. 2A is a plan view of the semiconductor chip according to the first embodiment.

DETAILED DESCRIPTION

Figure 1:
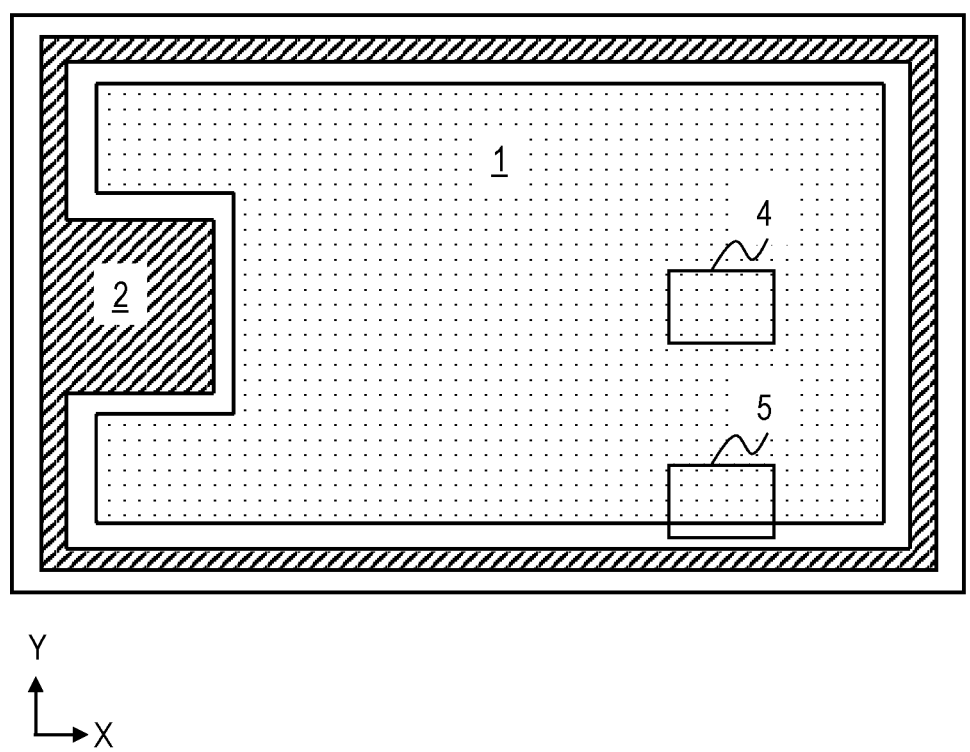
FIG. 1 is a plan view of a semiconductor chip according to a first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a plan view of a semiconductor chip (device) 100 according to the first embodiment.

In FIG. 1, in order to simplify understanding, the insulating film is made transparent. As shown in FIG. 1, most of the surface of the semiconductor chip 100 is covered with the emitter electrode 1, and a gate electrode 2 is formed on the outer periphery of the emitter electrode 1. A collector electrode 3 is formed on the back surface of the semiconductor chip 100. An emitter potential is supplied to the emitter electrode 1, and a gate potential is supplied to the gate electrode 2.

Figure 2B:
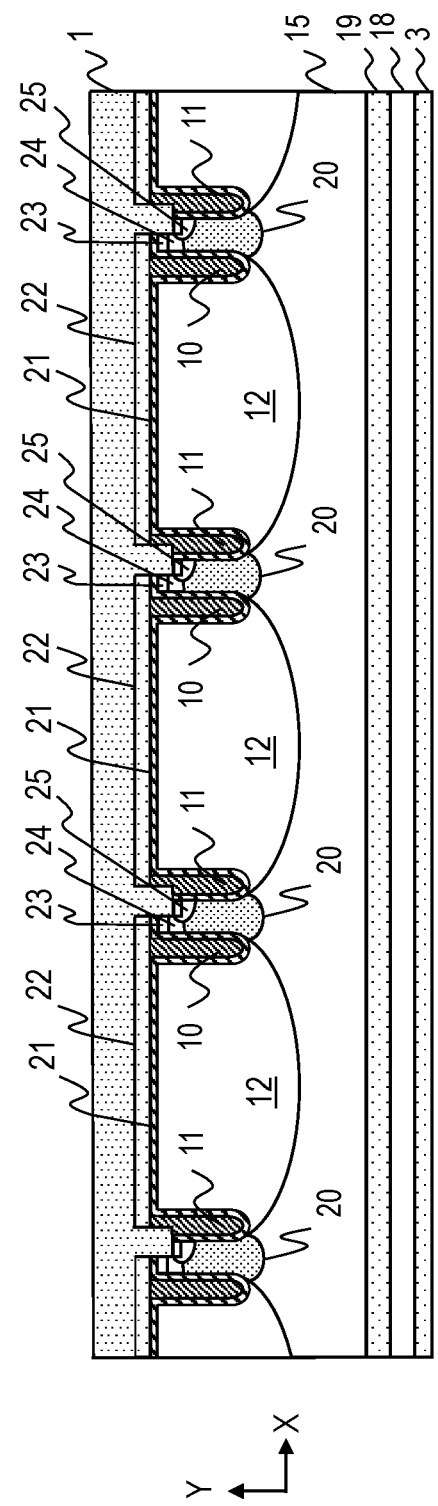
FIG. 2B is a cross-sectional view of the semiconductor chip according to the first embodiment.

FIG. 2A is an enlarged view of the region 4 of FIG. 1 and is a main portion of the semiconductor chip 100. For the sake of clarity, the FIG. 2A shows the interlayer insulating film as being transparent. FIG. 2B is a cross-sectional view along A-A' line in FIG. 2A.

The semiconductor chip 100 is a GE-S type (GE type shrink structure) IGBT which is a type of IE type IGBT. As shown in FIG. 2A, 2B, the semiconductor chip 100 is formed on a semiconductor substrate with an emitter electrode 1, a collector electrode 3, a p+ type collector layer 18, an n+ type field stop layer 19, and an n– type drift layer 15. The semiconductor chip 100 further includes a gate potential trench electrode (hereinafter referred to as a gate potential trench or a trench gate of a gate potential) 10 to which a gate potential is supplied, and an emitter potential trench electrode (hereinafter referred to as an emitter potential trench or a trench gate of an emitter potential) 11 to which an emitter potential is supplied. A high concentration n+ type hole barrier layer 20 is formed between the gate potential trench 10 and the emitter potential trench 11. A region formed by the gate potential trench 10, the emitter potential trench 11, and the hole barrier layer 20 is an active cell region. A p+ type (first conductivity type) floating layer (non-active cell region) is formed between the two active cell regions.

An emitter electrode 1 is connected to the emitter potential trench 11 via a contact hole. The emitter electrode 1 is connected to the p+ type body layer 25 through a contact hole and a body contact. An n+ type emitter layer 23 and a p+ type base layer 24 are formed between the gate potential trench 10 and the contact hole of the emitter electrode 1. In FIG. 2A, reference numeral 17 denotes a body contact Si (Silicon) trench. 21 in FIG. 2B is a gate insulating film, 22 is an interlayer insulating film.

Next, a diode and a floating-layer control gate (FC-GATE), which are the features of the first embodiment, will be described. As shown in FIG. 2A, the gate potential trench 10 has a shape having a straight line portion extending in the Y-axis direction (first direction) and a bent portion extending in the X-axis direction (second direction), in short, an L-shape (first shape), and forms a first trench electrode (first gate potential trench electrode). Further, the gate potential trench 10 has a shape (second shape) that is line symmetric with a line parallel to the X-axis from the first shape, and forms a second trench electrode (second gate potential trench electrode). Two p+ type impurity layers 13 and an n+ type impurity layer 14 are formed in a region sandwiched between the first and second shapes of the gate potential trench 10. The FC-GATE 16 is formed so as to cover at least two p+ type impurity layers 13 and the n+ type impurity layer 14. The FC-GATE 16 is Poly-Si(Polycrystalline Silicon) and is connected to the gate electrode 2.

Figure 3:
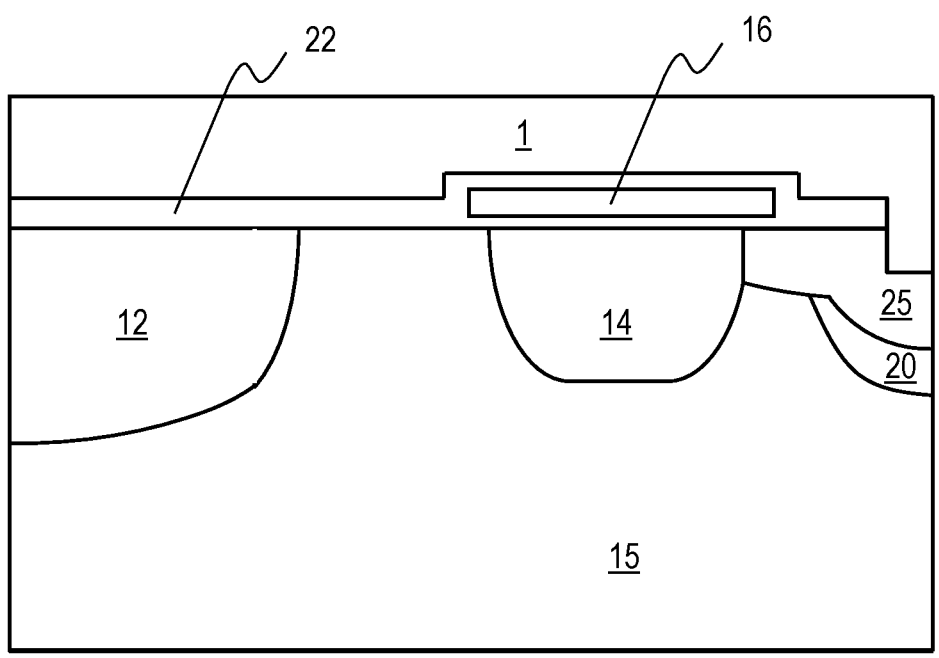
FIG. 3 is a cross-sectional view of the semiconductor chip according to the first embodiment.
Figure 4:
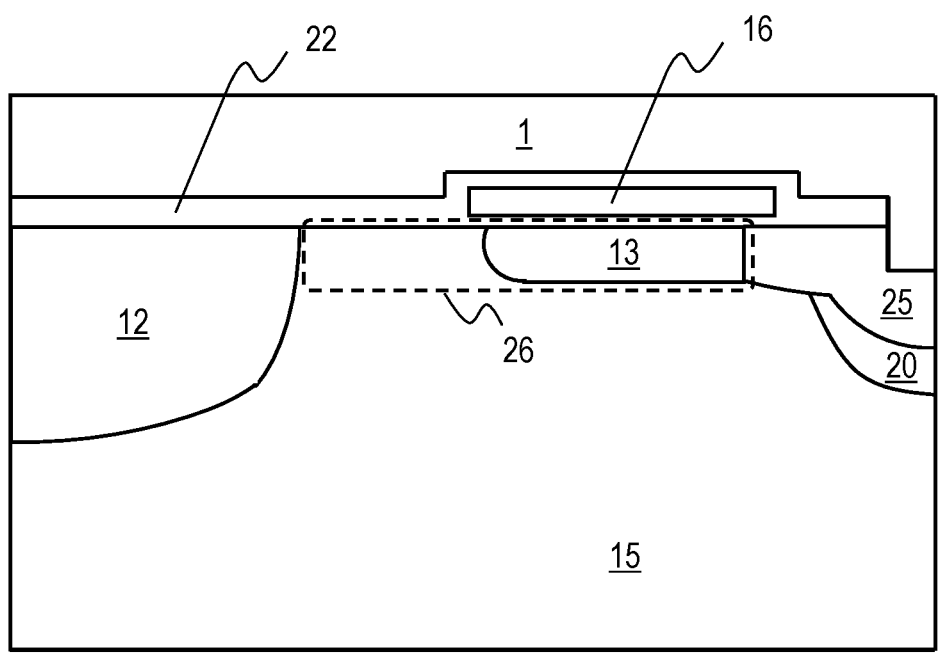
FIG. 4 is a cross-sectional view of the semiconductor chip according to the first embodiment.
Figure 5:
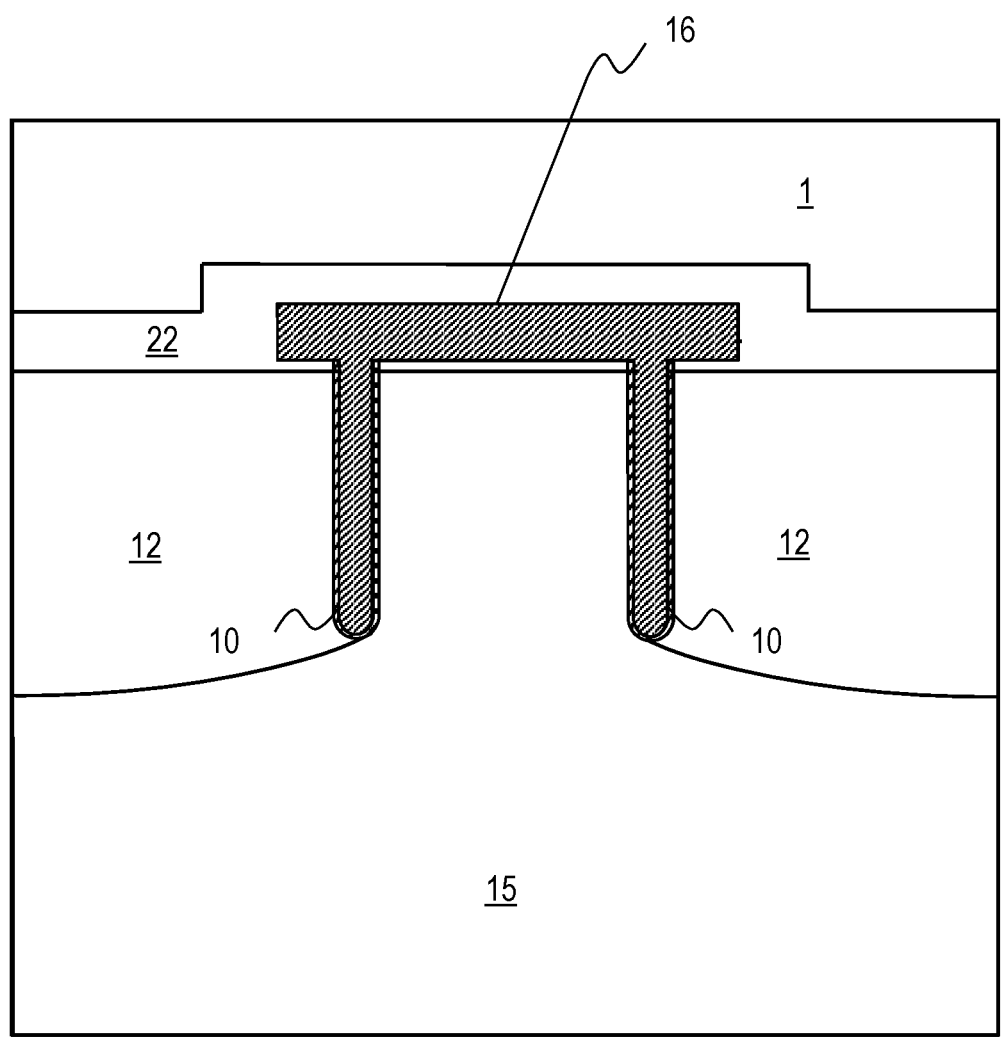
FIG. 5 is a cross-sectional view of the semiconductor chip according to the first embodiment.
Figure 6:
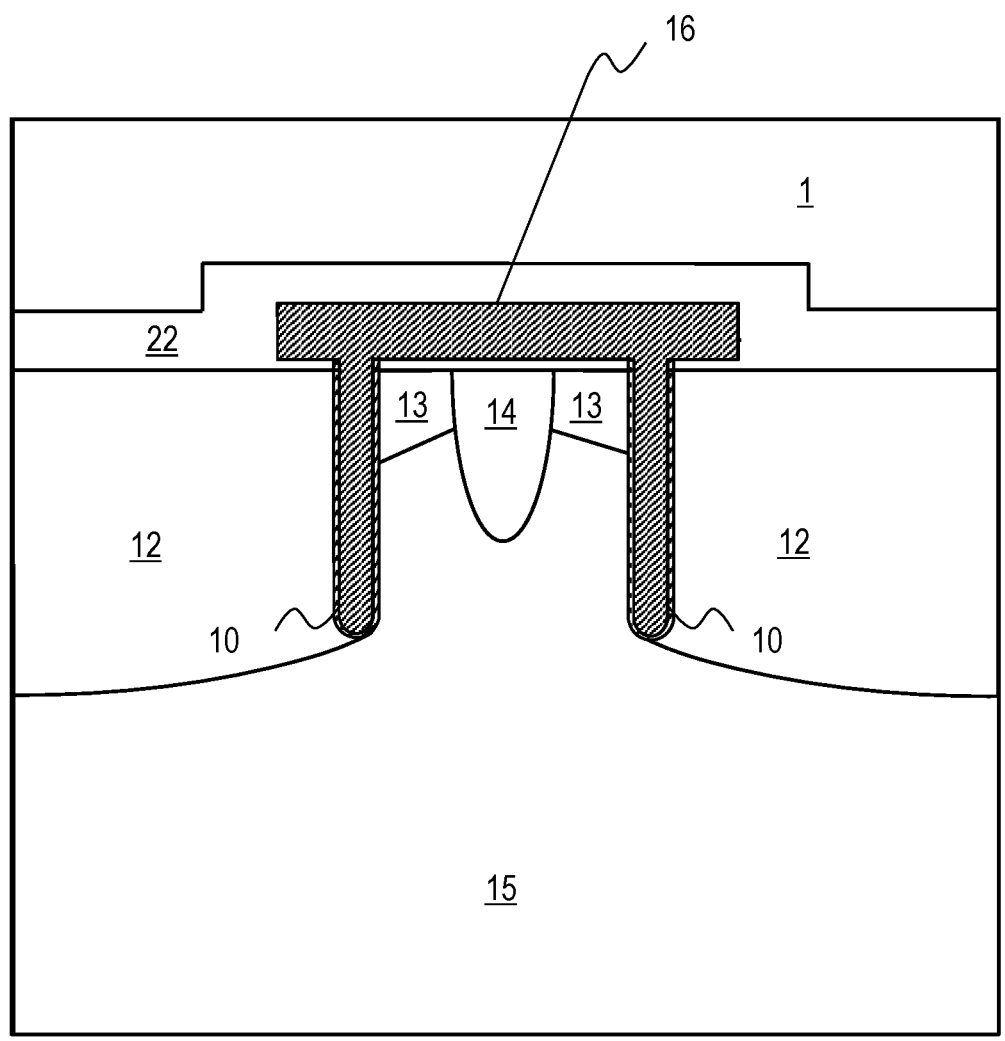
FIG. 6 is a cross-sectional view of the semiconductor chip according to the first embodiment.

More details of the semiconductor chip 100 will be described using FIGS. 3 to 6. FIG. 3 is a cross-sectional view along B-B' line of the FIG. 2A. FIG. 4 is a cross-sectional view along C-C' line of the FIG. 2A. FIG. 5 is a cross-sectional view along D-D' line of the FIG. 2A. FIG. 6 is a cross-sectional view along E-E' line of the FIG. 2A. As shown in FIG. 3, the n+ type impurity layer 14 is formed in contact with the p+ type body layer 25. As shown in FIG. 4, the p+ type impurity layer 13 is formed so as to be in contact with the p+ type body layer 25. Since the body layer 25 and the impurity layer 13 are of the same p+ type, they are also referred to as a p+ type impurity layer. Since the n-type drift layer 15 is formed between the p+ type impurity layer 13 and the floating layer 12, the diode 26 is formed by the p+ type impurity layer 13 and the n– type drift layer 15. As shown in FIG. 6, each of the two p+ type impurity layers 13 is formed so as to be in contact with the gate potential trench 10. The n+ type impurity layer 14 is formed so as to be sandwiched between the two p+ type impurity layers 13.

Next, the operation of the semiconductor chip 100 will be described. Since the basic operation of IGBT except for the p+ type impurity layer 13, the n+ type impurity layer 14, and FC-GATE 16 is the same as that of the related art, the explanation of the basic operation of IGBT is omitted. Therefore, here, the floating layer 12, the p+ type impurity layer 13, the n+ type impurity layer 14, and FC-GATE 16 will be described with reference to FIGS. 7 to 10.

First, a case where IGBT is turned on will be described. At this time, a positive voltage (e.g., +15 V) is applied to the gate. When the positive voltage is applied to the gate, a positive voltage is also applied to FC-GATE 16. Further, during the turn-on (period from off to on), although the voltage of the collector electrode 3 (VCE) gradually decreases, a high voltage is still applied to the collector electrode 3.

Figure 7:
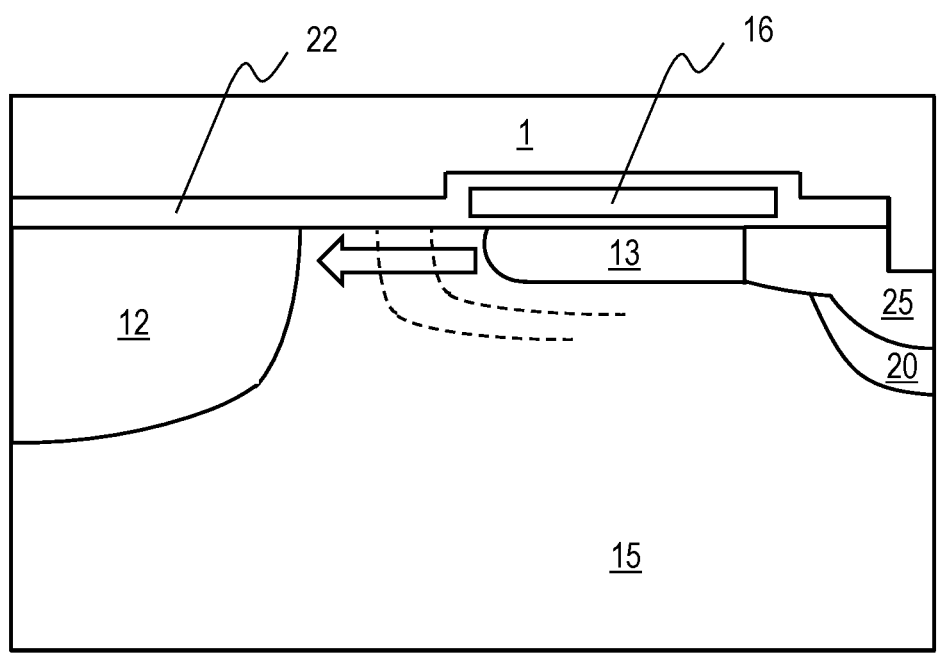
FIG. 7 is a diagram for explaining an operation of the semiconductor chip according to the first embodiment.

As shown in FIG. 7, a depletion layer is formed at the pn junction of the diode 26, i.e., at the junction between the p+ type impurity layer 13 and the n– type drift layer 15. Since the impurity concentration of the n– type drift layer 15 is low, the expansion of the depletion layer is promoted. As seen from the carriers (holes) in the floating layer 12, the diode 26 becomes reverse-biased, so that the depletion layer further spreads toward the floating layer 12 (arrow in FIG. 7). The application of a high voltage to the collector electrode 3 (VCE) also contributes to the expansion of the depletion layer.

Due to the expansion of the depletion layer of the diode 26, a path for discharging carriers (holes) of the floating layer 12 is not formed between the floating layer 12 and the body layer 25. In this state, the carrier discharge suppressing function of the floating layer 12 functions to obtain an IE effect.

Figure 8:
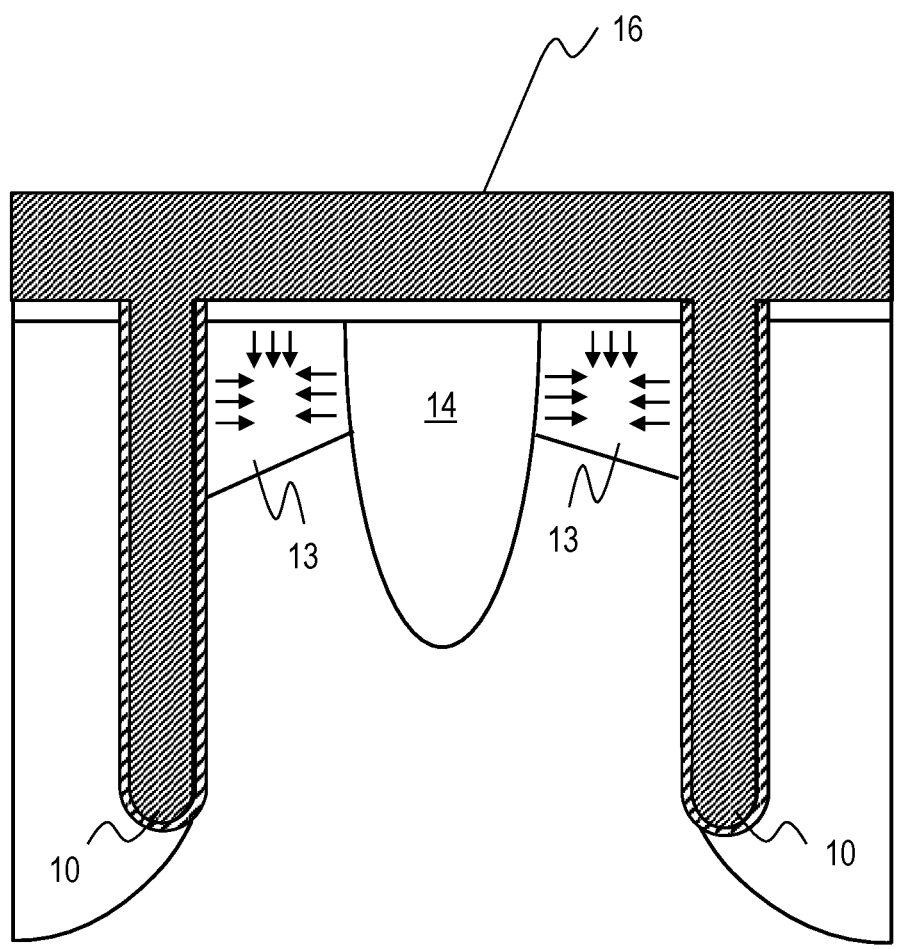
FIG. 8 is a diagram for explaining the operation of the semiconductor chip according to the first embodiment.

The depletion layer formed in the diode 26 will be further described. FIG. 8 shows a condition in which a positive voltage is applied to FC-GATE 16. As shown in FIG. 8, when a positive voltage is applied to FC-GATE 16, a depletion layer is formed between FC-GATE 16 and the p+ type impurity layer 13 (arrow from FC-GATE 16 and gate potential trench 10 toward the p+ type impurity layer 13), and since the n+ type impurity layer 14 is in contact with the p+ type impurity layer 13, a depletion layer is also formed between the p+ type impurity layer 13 and the n+ type impurity layer 14 (arrow from the n+ type impurity layer 14 toward the p+ type impurity layer 13). Therefore, the hole path in the p+ type impurity layer 13 is narrowed as in the case of JFET. As a result, the carrier discharge suppressing function of the floating layer 12 is further enhanced.

Next, a case where IGBT is turned off will be described. At this time, a negative voltage (e.g., −15 V) is applied to the gate. When a negative voltage is applied to the gates, the negative voltage is also applied to FC-GATE 16. During the turn-off, the voltage VCE of the collector electrode 3 gradually rises.

Figure 9:
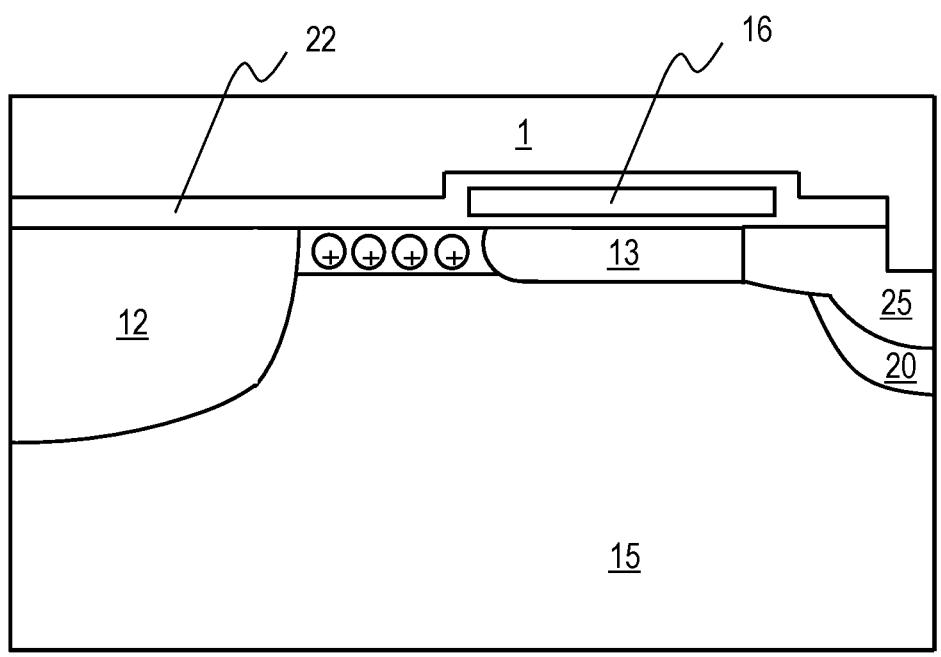
FIG. 9 is a diagram for explaining the operation of the semiconductor chip according to the first embodiment.

As shown in FIG. 9, when the voltage (VCE) of the collector electrode 3 gradually rises, holes collect in the n− portion (the surface of the n− type body layer 15) of the diode 26, and a hole path is formed. The low impurity concentration of the body layer 15 also contributes to hole path formation. When the hole path is formed, a path for discharging carriers (holes) of the floating layer 12 is formed between the floating layer 12 and the p+ type impurity layer 13.

Figure 10:
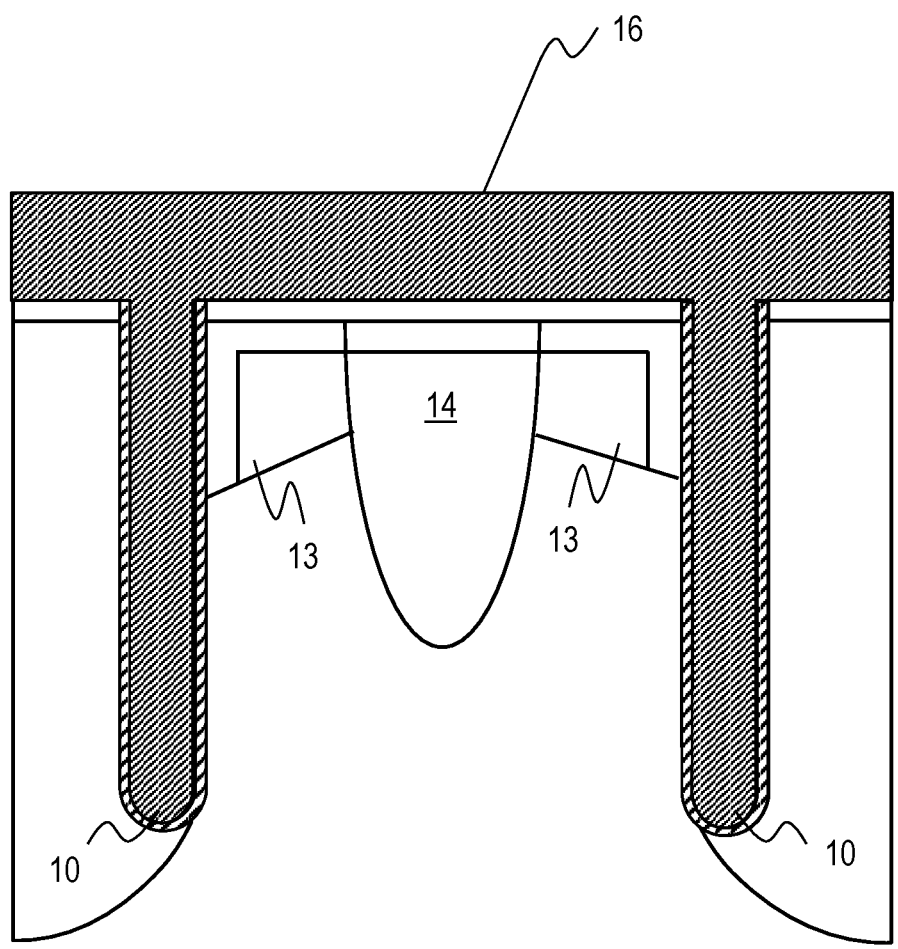
FIG. 10 is a diagram for explaining the operation of the semiconductor chip according to the first embodiment.

FIG. 10 shows the p+ type impurity layers 13 of the diode 26 when the negative voltage is applied to FC-GATE 16. As shown in FIG. 10, when the negative voltage is applied to FC-GATE 16, hole paths are formed on the surface of the p+ type impurity layer 13, the interface between the p+ type impurity layer 13 and the gate potential trench 10, and the surface of the n+ type impurity layer 14. As compared with the turn-on time, a wide hole path is formed.

Therefore, at the time of turn-off, a hole path is formed from the floating layer 12 to the body layer 25, and carriers (holes) of the floating layer 12 are discharged to the body layer 25 and the emitter electrode 1. In this state, the carrier discharge suppressing function of the floating layer 12 does not function. At the time of turn-off, the discharge of carriers is promoted, so that high-speed switching becomes possible. Note that the voltage applied to FC-GATE 16 does not have to be a negative voltage. This is because, as described above, the high voltage is applied to the collector electrode 3 and the impurity concentration of the body layer 15 is low, and therefore, the hole path is formed without applying the negative voltage to FC-GATE 16.

So far, region 4 of FIG. 1 of semiconductor chip 100 has been described. Here, another region of the semiconductor chip 100 will be described.

Figure 11A:
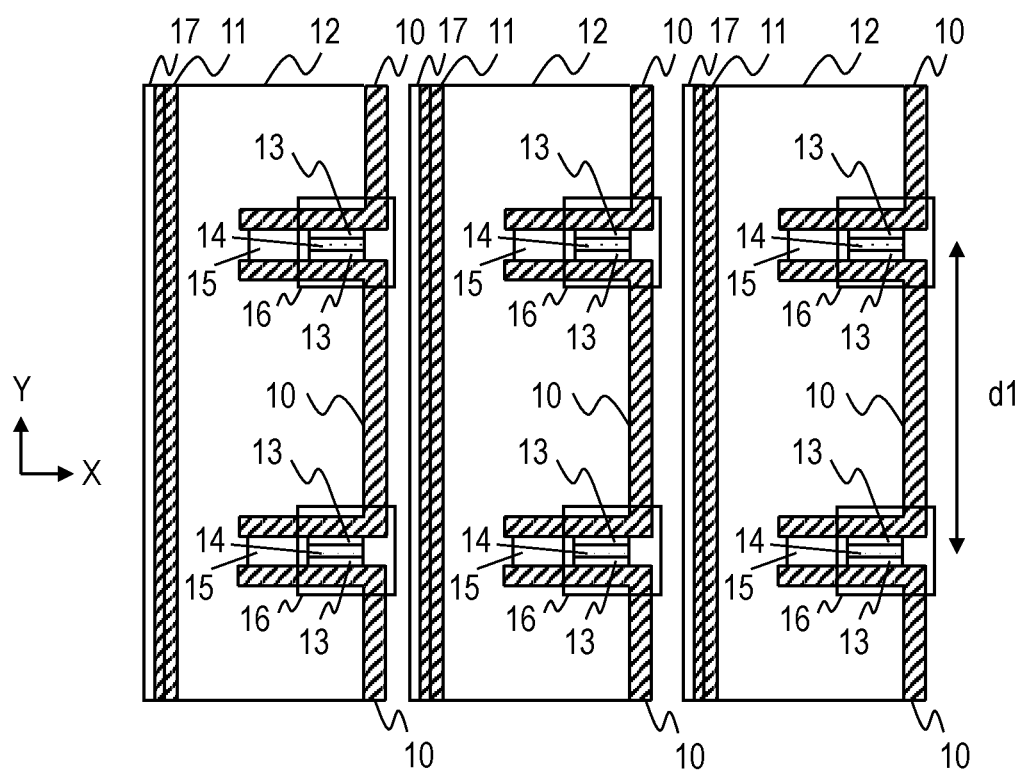
FIG. 11A is a plan view of the semiconductor chip according to the first embodiment.

FIG. 11A is an enlarged view of a region wider than the region 4 of FIG. 1. As shown in FIGS. 2A and 11A, the semiconductor chip 100 is formed by an active cell region and a non-active cell region (floating layer 12) adjacent the active cell region extending in the Y-axis direction. In the first embodiment 1, as described above, the gate potential trench 10 is bent in the X-axis direction to form the diode 26 and FC-GATE 16. A plurality of diodes 26 and a plurality of FC-GATE 16 are arranged. For example, as shown in FIG. 11A, the diodes 26 and FC-GATE 16 are arranged at a distance d1 in the Y-axis direction.

Here, the active cell region and the termination region will be described. A p+ type cell peripheral junction region and a termination region (both not shown) are disposed outside the active cell region (peripheral portion of the semiconductor chip 100) so as to surround the active cell region. Since these regions, called a terminal region, are non-active cell regions and have no hole discharge paths, current concentrates in regions adjacent to the terminal region in the active cell regions, which may cause device breakdown and the like. Therefore, in the first embodiment, in order to reduce the current concentration, the diodes 26 and FC-GATE 16 are arranged densely in the region adjoining to the terminal region in the active cell region.

Figure 11B:
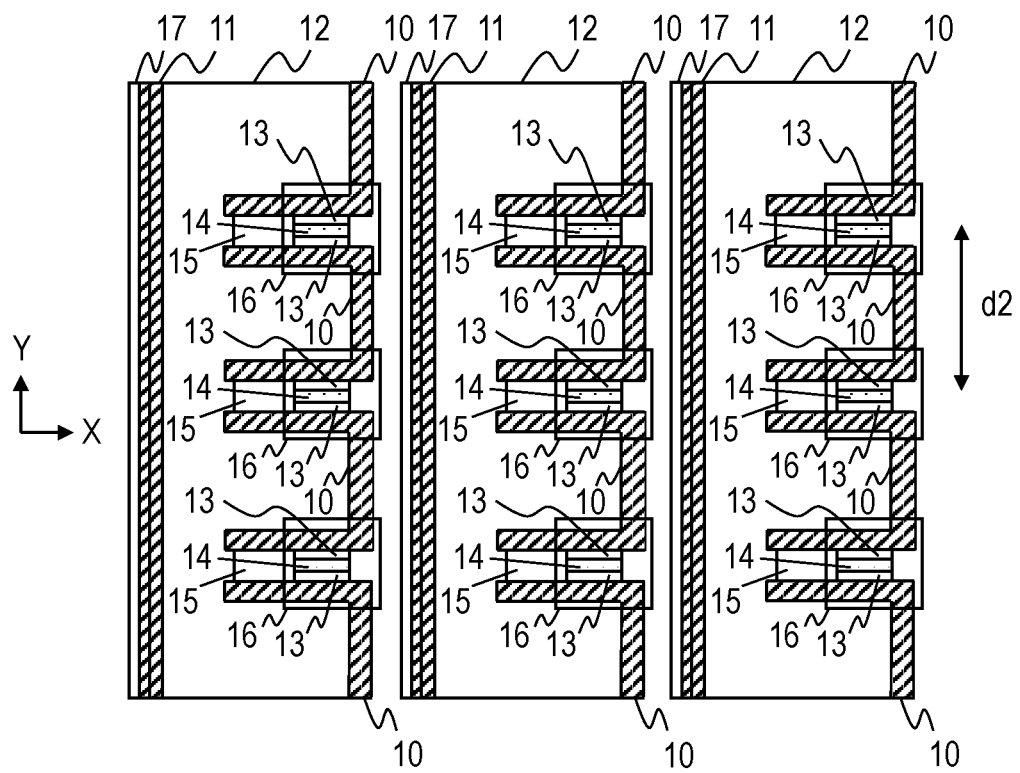
FIG. 11B is a plan view of the semiconductor chip according to the first embodiment.

FIG. 11B is an enlarged view of region 5 of FIG. 1, the active cell region adjacent to the terminal region. As shown in FIG. 11B, the diodes 26 and FC-GATE 16 are arranged at a distance d2 in the Y-axis direction. Where d1>d2. That is, the arrangement density of the diodes 26 and FC-GATE 16 in the active cell region adjoining the terminal region of the semiconductor chip 100>the arrangement density of the diodes 26 and FC-GATE 16 in the active cell region in the center portion of the semiconductor chip 100.

As described above, in first embodiment according to semiconductor chip 100, the diode 26 are provided between the floating layer 12 and the body layer 25. In addition, FC-GATE 16 is provided above the p+ type impurity layer 13, so that whether or not the floating layer 12 functions can be controlled. As a result, it is possible to achieve both the improvement of the IE effect and the reduction of the switching loss (Eoff) at the time of turn-off.

Second Embodiment

Figure 12:
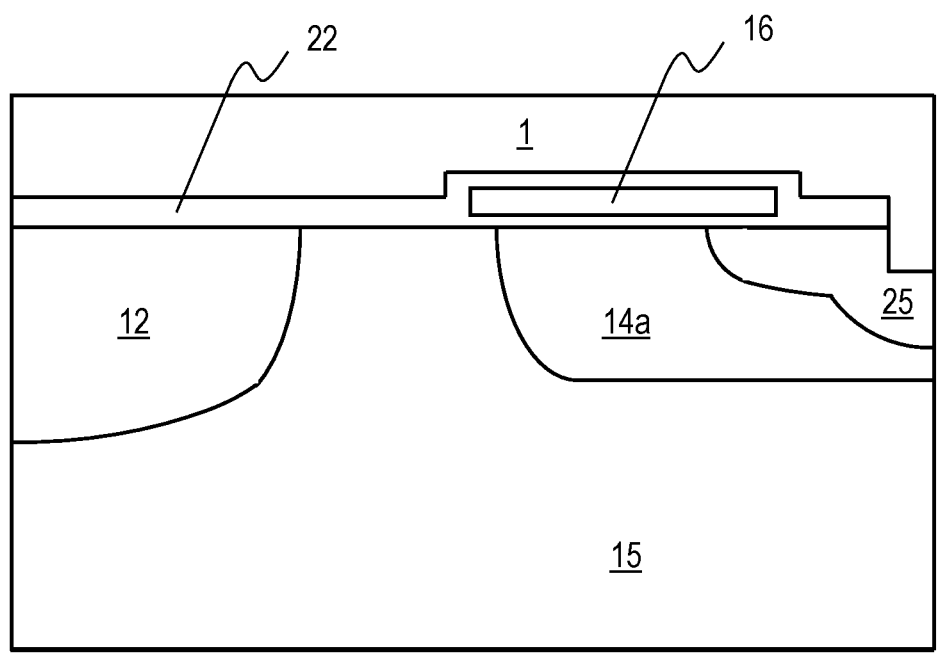
FIG. 12 is a cross-sectional view of a semiconductor chip according to a second embodiment.
Figure 13:
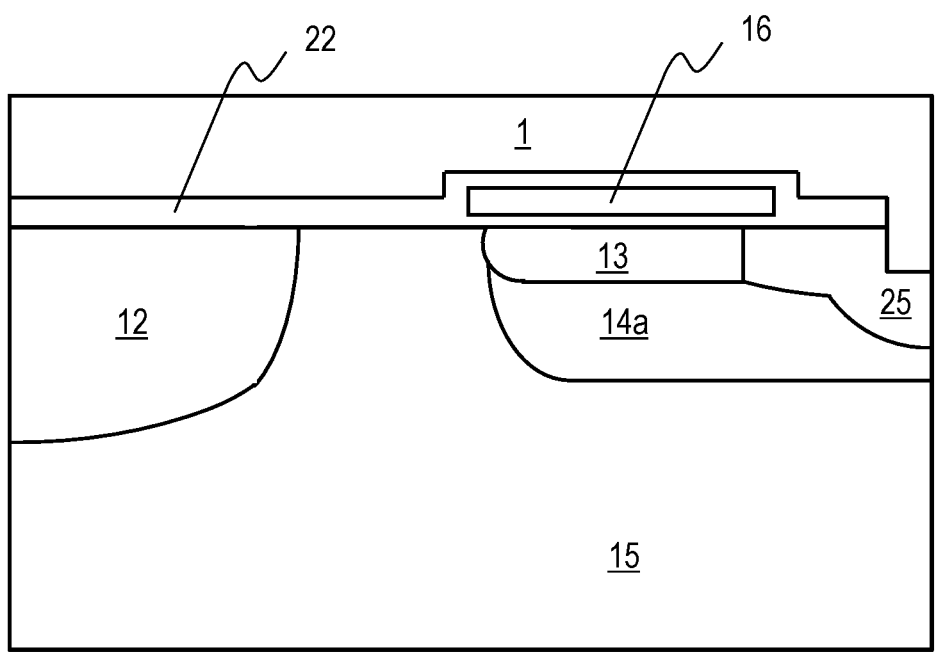
FIG. 13 is a cross-sectional view of the semiconductor chip according to the second embodiment.
Figure 14:
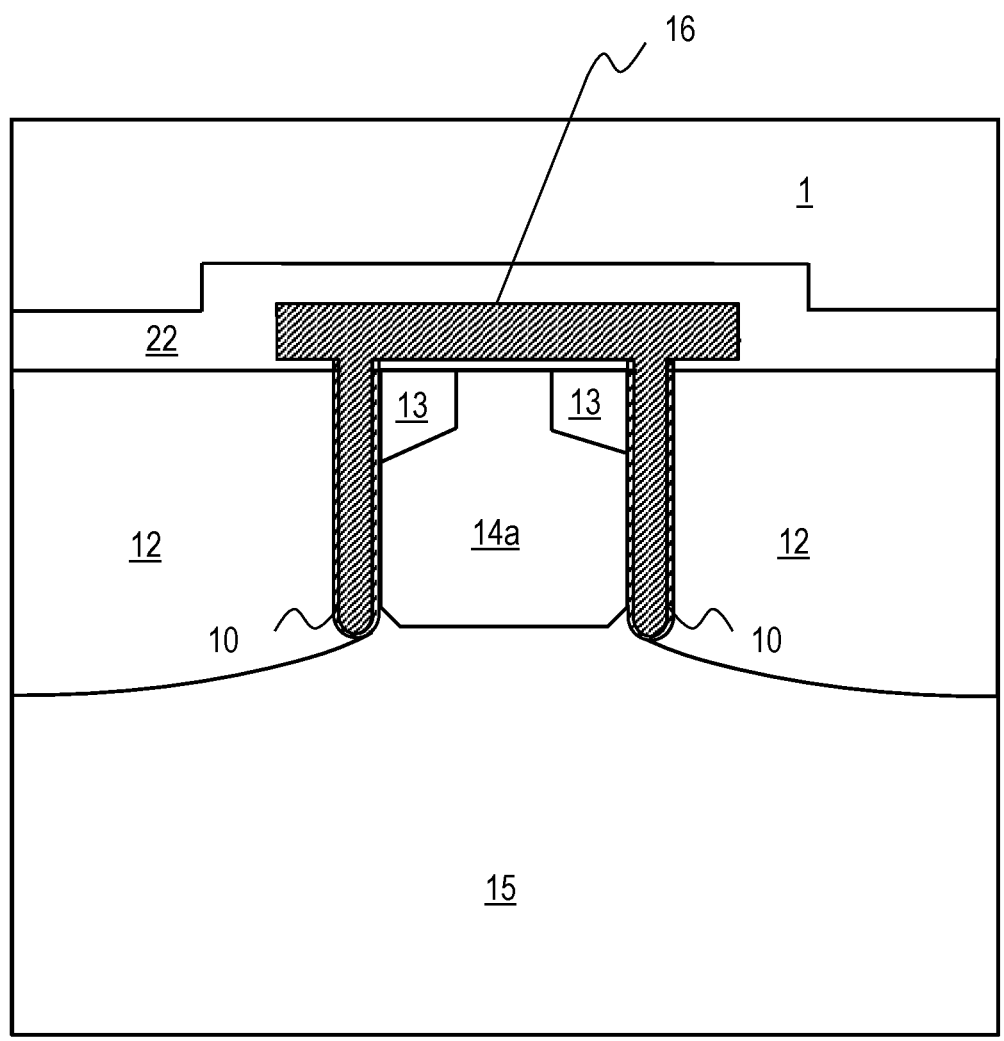
FIG. 14 is a cross-sectional view of the semiconductor chip according to the second embodiment.

A plan view of a semiconductor chip according to the second embodiment is the same as in FIG. 1. An enlarged view of the region 4 in FIG. 1 is also the same as FIG. 2A. FIG. 12 is a cross-sectional view along B-B' line of FIG. 2A. FIG. 13 is a cross-sectional view along C-C' line of the FIG. 2A. FIG. 14 is a cross-sectional view along E-E' line of the FIG. 2A. A cross-sectional view along D-D' line of the FIG. 2A is the same as in FIG. 5.

The difference from first embodiment is a shape of an n+ type impurity layer 14a. In the second embodiment, the n+ type impurity layer 14 and the n+ type hole barrier layer 20 are connected to each other to form an n+ type impurity layer 14a. By forming a high-concentration n+ layer on the entire lower surface of the body layer 25, the IE effect can be improved more than the IE effect of the first embodiment.

In order to suppress a process cost, it is desirable to form the impurity layer 14a by simultaneously forming the impurity layer 14 and the body layer 20. However, when it is desired to change the impurity concentration of the impurity layer 14 and the body layer 20, they may be formed individually.

The operation of the semiconductor chip according to the second embodiment is the same as that of first embodiment, and therefore the explanation thereof is omitted.

As described above, the semiconductor device according to the second embodiment can achieve both the IE-effect improvement and Eoff reduce at the time of turn-off in the same manner as the first embodiment. The second embodiment can further improve the IE-effect.

Third Embodiment

Figure 15:
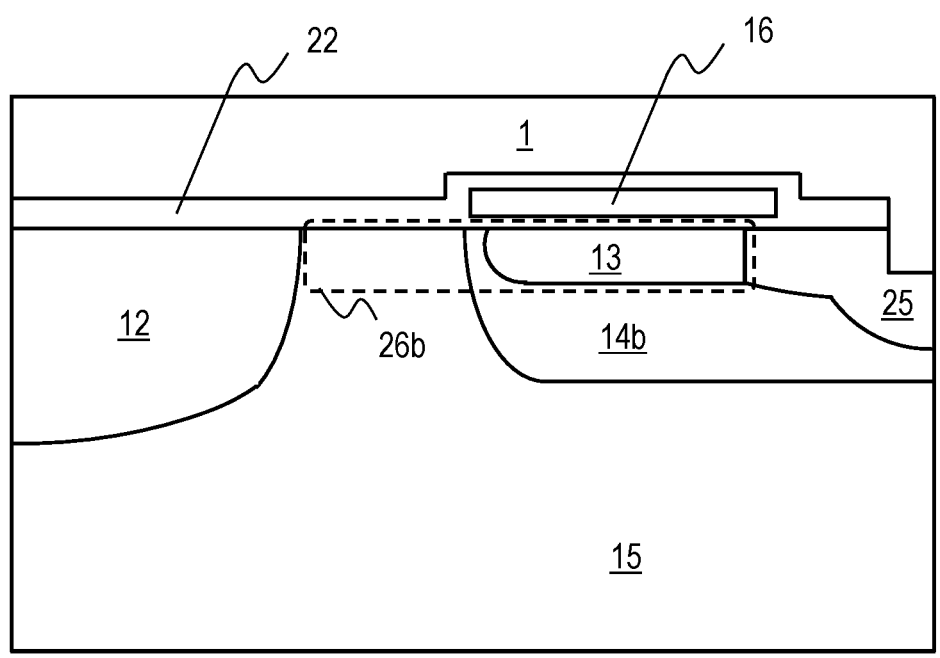
FIG. 15 is a cross-sectional view of a semiconductor chip according to a third embodiment.

A plan view of a semiconductor chip according to the third embodiment is the same as in FIG. 1. An enlarged view of the region 4 in FIG. 1 is also the same as FIG. 2A. FIG. 15 is a cross-sectional view along B-B' line of the FIG. 2A. The rest of cross-sectional view is the same as the second embodiment.

The difference from the second embodiment is the shape of an n+ type impurity layer 14b. By adding an n+ type impurity layer to a front of the p+ type impurity layer 13, the n+ type impurity layer 14b is formed so as to cover the p+ type impurity layer 13. In the first and second embodiments, the diode 26 is composed of p+ and n−, while diode 26b of the third embodiment is composed of p+, n+, and n−. Since the hole path is more difficult to form as compared with the first and second embodiments, the IE-effect at the time of turning on IGBT can be enhanced.

As described above, the semiconductor chip according to the third embodiment can achieve both the IE-effect improvement and Eoff reduce at the time of turn-off in the same manner as the first and second embodiments. In the third embodiment, the IE-effect at the time of turning on IGBT can be further improved.

Fourth Embodiment

Figure 16:
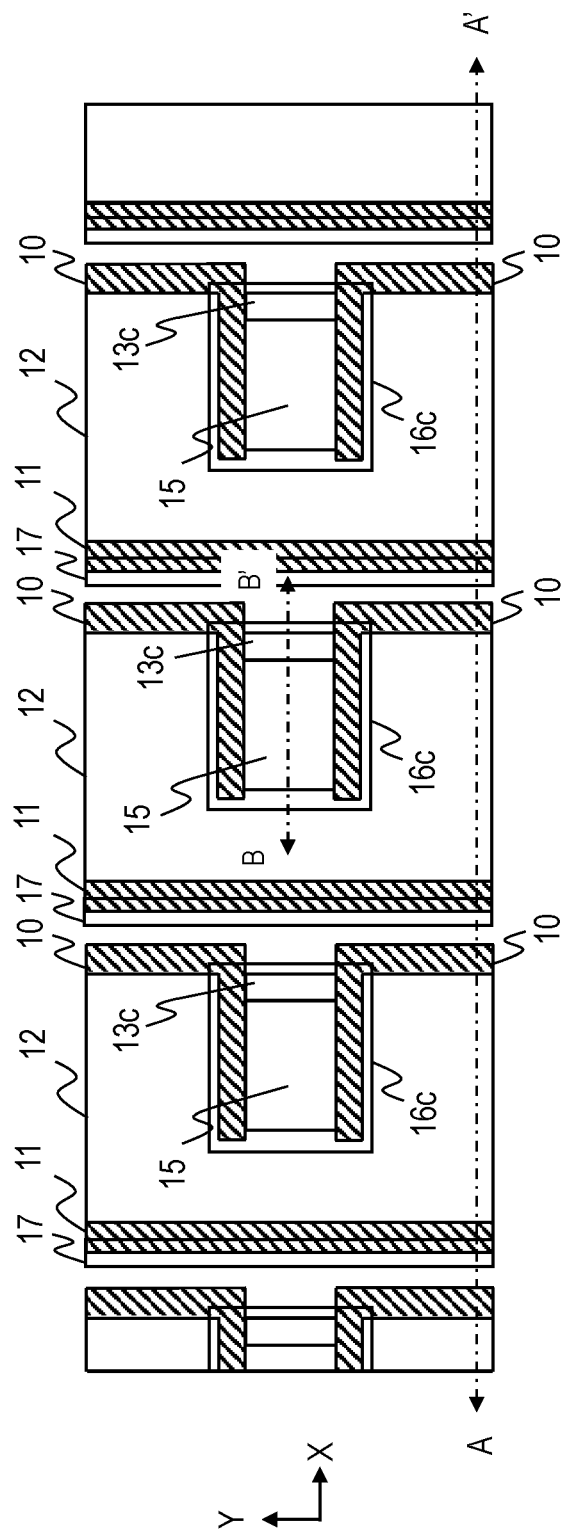
FIG. 16 is a plan view of a semiconductor chip according to a fourth embodiment.

A plan view of a semiconductor chip according to a fourth embodiment is the same as in FIG. 1. FIG. 16 is an enlarged view of region 4 of FIG. 1. The difference from the first embodiment is that the n+ type impurity layer 14 is omitted and the p+ type impurity layer 13c is one. FC-GATE 16c is formed so as to cover the p+ type impurity layer 13c and the drift layer 15 between the floating layer 12 and the p+ type impurity layer 13c.

Figure 17:
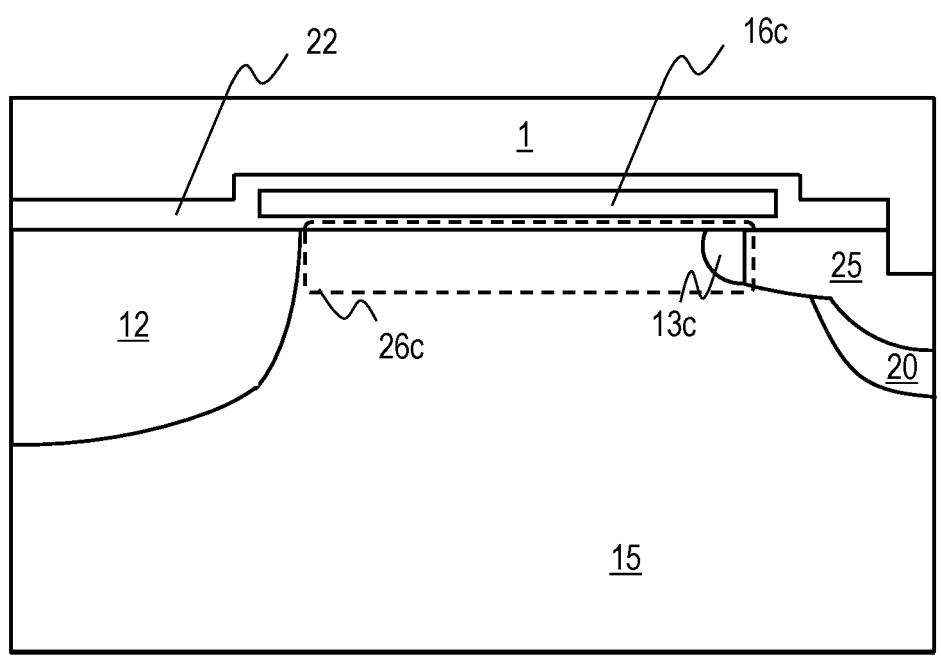
FIG. 17 is a cross-sectional view of the semiconductor chip according to the fourth embodiment.

FIG. 17 is a cross-sectional view along B-B' line of FIG. 16. As shown in FIG. 17, the diode 26c is formed of the p+ type impurity layer 13c and the n− type drift layer 15 in contact with the body layer 25.

As for the diode 26c, the operation of the semiconductor chip in the fourth embodiment is the same as the diode 26 (the first embodiment). However, in the fourth embodiment, since the n+ type impurity layer 14 is omitted, there is no operation related to the n+ type impurity layer 14.

As described in the first embodiment, since the depletion layer of the diodes 26c expands when IGBT is turned on, the carrier discharge suppressing function of the floating layer 12 functions. Therefore, the IE effect can be obtained at the time of turn-on. On the other hand, at the time of turn-off, since a hole path is formed in the n− portion of the diode 26c (the surface of the n− type drift layer 15), the carrier discharge suppressing function of the floating layer 12 does not function. Since the discharge of carriers is promoted at the time of turn-off, high-speed switching becomes possible.

In the fourth embodiment, FC-GATE 16c also covers the n-portions of the diode 26c (the surface of the n− type drift layer 15). At the time of turn-off, the negative voltage is applied to FC-GATE 16c, so that a hole path is more easily formed.

As described above, the semiconductor chip according to the fourth embodiment can achieve both the IE-effect improvement and Eoff reduce at the time of turn-off in the same manner as the first embodiment. Since the structure is simpler than the structure of first embodiment, manufacturing costs can be reduced.

Figure 18:
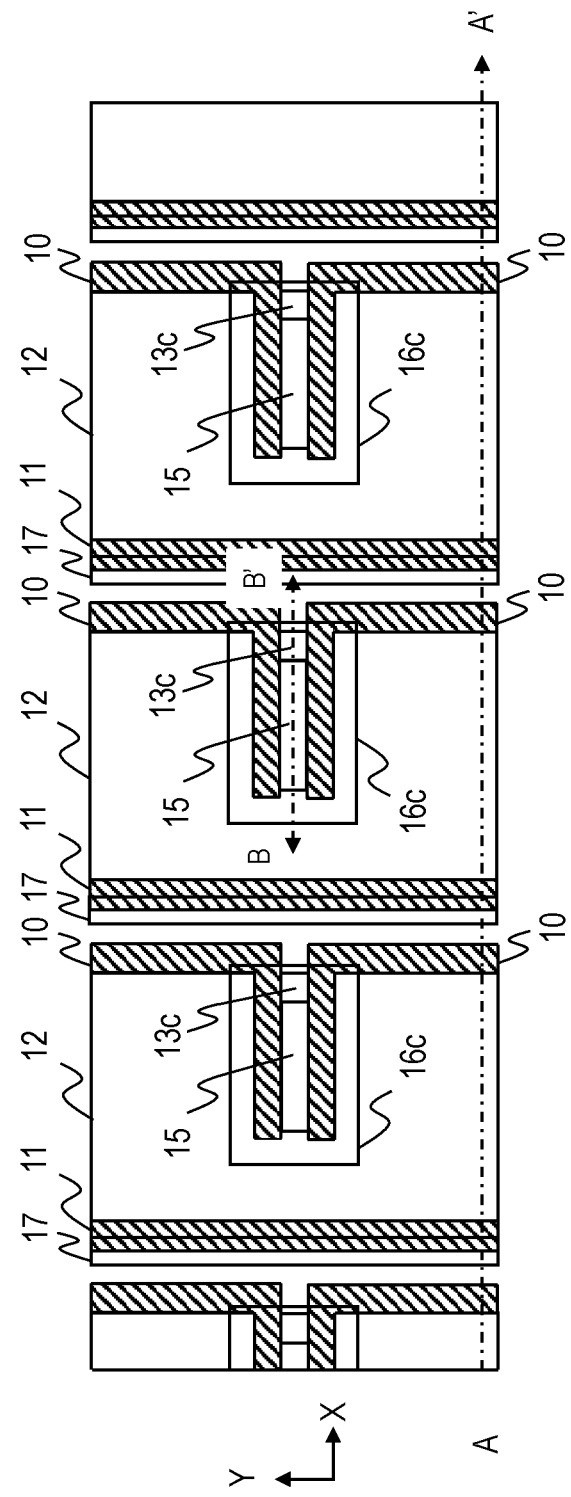
FIG. 18 is a plan view of the semiconductor chip according to the fourth embodiment.

As shown in FIG. 18, when the interval between the first and second shapes of the gate potential trench 10 is narrowed, the hole discharge path is narrowed, and the IE effect can be improved.

Fifth Embodiment

Figure 19:
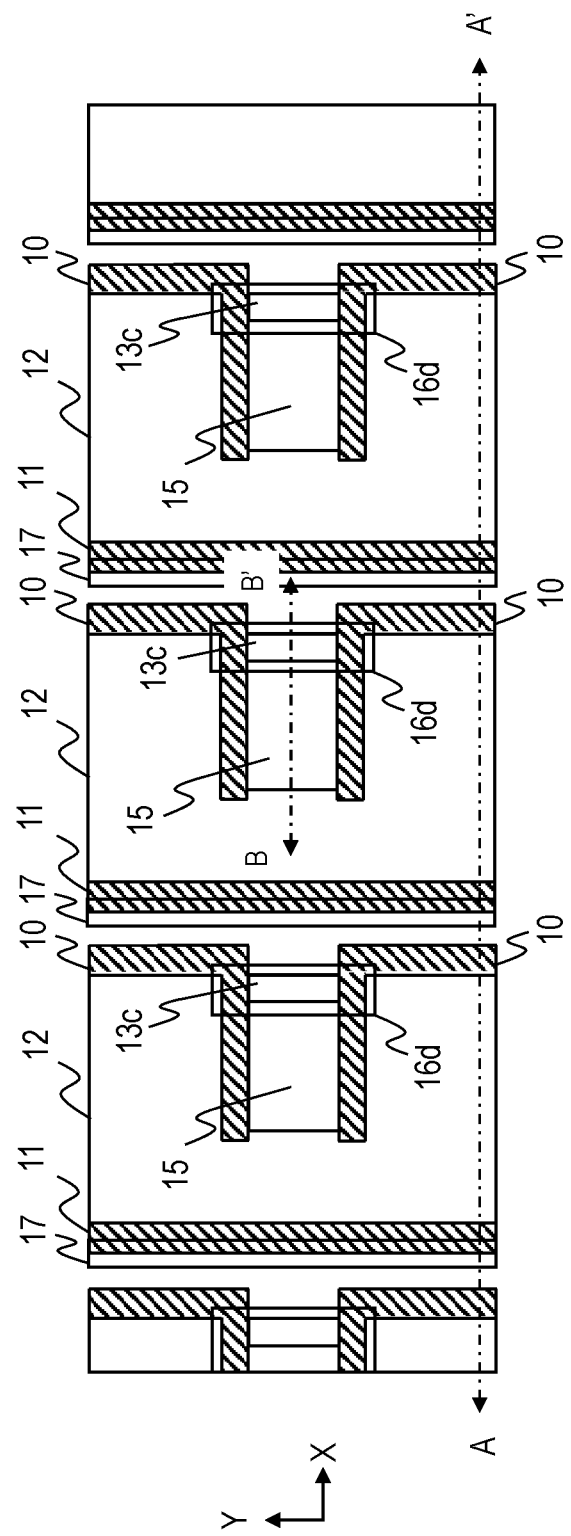
FIG. 19 is a plan view of a semiconductor chip according to a fifth embodiment.

A plan view of a semiconductor chip according to the fifth embodiment is the same as in FIG. 1. FIG. 19 is an enlarged view of region 4 of FIG. 1. The difference from fourth embodiment is FC-GATE 16d. FC-GATE 16d is formed so as to cover the p+ type impurity layer 13c.

Figure 20:
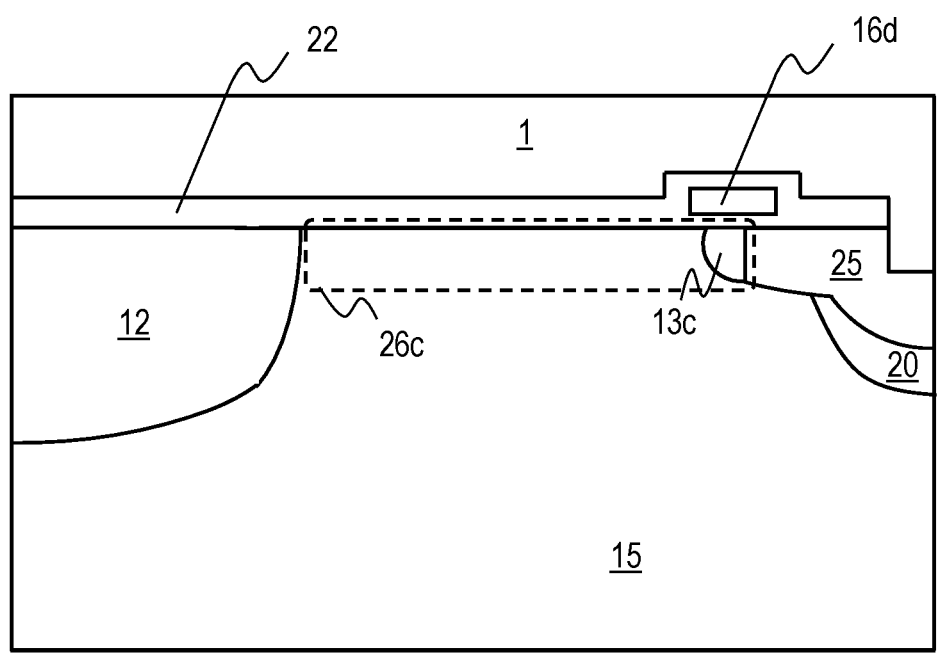
FIG. 20 is a cross-sectional view of the semiconductor chip according to the fifth embodiment.

FIG. 20 is a cross-sectional view along B-B' line of FIG. 19. As shown in FIG. 20, FC-GATE 16d is formed on the p+ type impurity layer 13c.

FIG. 18 can be applied to the fifth embodiment.

The operation of the semiconductor chip according to the fifth embodiment is the same as that of the fourth embodiment, and therefore the explanation thereof is omitted. Since an area of FC-GATE 16d is reduced as compared with the fourth embodiment, a gate capacitance can be reduced (in case where FC-GATE 16d is coupled to the gate of IGBT). The reduced gating capacitance improves the switching speed of IGBT.

As described above, the semiconductor chip according to the fifth embodiment can achieve both the IE-effect improvement and Eoff reduce at the time of turn-off in the same manner as the fourth embodiment. As a result, further gate can be reduced.

Sixth Embodiment

Figure 21:
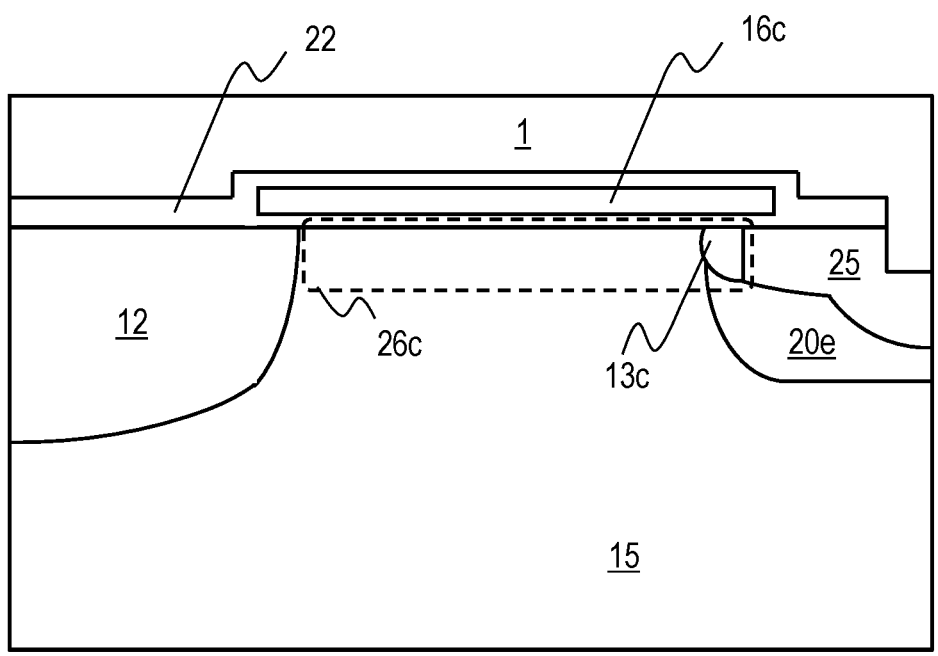
FIG. 21 is a cross-sectional view of a semiconductor chip according to a sixth embodiment.

A plan view of a semiconductor chip of the sixth embodiment is the same as in FIG. 1. FIG. 21 is a cross-sectional view along B-B' line of FIG. 16. The difference from the fourth embodiment is that a hole barrier layer 20e is formed so as to cover the entire lower surface of the body layer 25.

FIG. 18 can be applied to present embodiment 6.

The operation of the semiconductor chip in the sixth embodiment is the same as that of the fourth embodiment, and therefore the explanation thereof is omitted. Since a high-concentration n+ layer is formed on the entire lower surface of the body layer 25, the IE effect can be improved more than the IE effect of the fourth embodiment.

As described above, the semiconductor chip of the sixth embodiment can achieve both the IE-effect improvement and Eoff reduce at the time of turn-off in the same manner as the fourth embodiment. The IE effect can be improved over the IE effect of the fourth embodiment.

Seventh Embodiment

Figure 22:
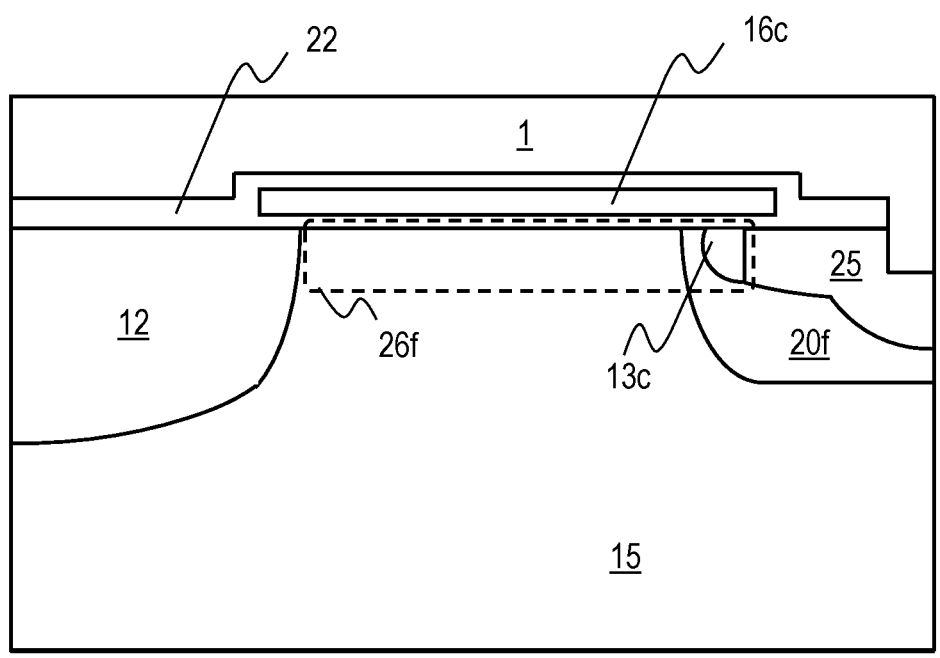
FIG. 22 is a cross-sectional view of a semiconductor chip according to a seventh embodiment.

A plan view of a semiconductor chip according to the seventh embodiment is the same as in FIG. 1. FIG. 22 is a cross-sectional view along B-B' line shown in FIG. 16

Cross-sectional view along B-B' line. The difference from the fourth to sixth embodiments is that an n+ type hole barrier layer 20f is formed so as to cover the whole of the p+ type body layer 25 and the p+ type impurity layer 13c. The diode 26c of the fourth to sixth embodiments is composed of p+ and n−, while a diode 26f of the seventh embodiment is composed of p+, n+ and n−. Compared to the fourth to sixth embodiments, since the hole path is harder to form, the IE-effect at the time of turning on IGBT can be enhanced.

FIG. 18 can be applied to the seventh embodiment.

As described above, the semiconductor chip of the seventh embodiment can achieve both the IE effect improvement and the switching loss (Eoff) reduce at the time of turn-off in the same manner as the fourth to sixth embodiments. The seventh embodiment can further improve the IE-effect when IGBT is turned on.

It should be noted that the present invention is not limited to the above-mentioned embodiments, and various modifications can be made without departing from the gist thereof.

For example, in the first to seventh embodiments, FC-GATE is connected to the gate electrode 2, but may be independently controlled without being connected to the gate electrode 2. For example, in IGBT where +15V is applied to the gate electrode when the gate is on, and 0V is applied to the gate electrode when the gate is off, +15V can be applied to FC-GATE when the gate is on, and −15V can be applied to FC-GATE when the gate is off.

In the first to seventh embodiments, the gate potential trench has an L shape, but the gate potential trench may have, for example, a P-shaped loop shape.

What is claimed is:

1. A semiconductor device comprising:
   a semiconductor substrate;
   a first trench electrode formed in the semiconductor substrate and having a first portion;
   a second trench electrode formed in the semiconductor substrate having a second portion facing the first portion;
   a floating layer of a first conductivity type formed around the first and second trench electrodes;

a drift layer of a second conductivity type connected to the floating layer of the first conductivity type and formed between the first and second trench electrodes;

an impurity layer of the first conductivity type connected to the drift layer of the second conductivity type and formed between the first and second trench electrodes; and a floating layer control gate having a portion located at least above the impurity layer of the first conductivity type.

2. The semiconductor device according to claim 1, further comprising:

an emitter electrode formed on a first surface of the semiconductor substrate;

a gate electrode formed on the first surface of the semiconductor substrate; and a collector electrode formed on a second surface of the semiconductor substrate, wherein the drift layer of the second conductivity type is formed in a layer above the collector electrode, wherein the first and second trench electrodes are coupled to the gate electrode, and wherein the impurity layer of the first conductivity type is coupled to the emitter electrode.

3. The semiconductor device according to claim 2, wherein the impurity layer of the first conductivity type has a first impurity layer connected to the first trench electrode and a second impurity layer connected to the second trench electrode, and wherein an impurity layer of the second conductivity type is formed between the first and second impurity layers, and wherein the floating layer control gate is disposed on the first and second impurity layers and the impurity layer of the second conductivity type.

4. The semiconductor device according to claim 3, wherein the impurity layer of the second conductivity type is formed under the first and second impurity layers.

5. The semiconductor device according to claim 3, wherein the impurity layer of the second conductivity type is formed to cover the first and second impurity layers.

6. The semiconductor device according to claim 3, wherein the first trench electrode has a portion extending in a first direction and a bent portion extending in a second direction in a plan view, wherein the second trench electrode has a shape that is line-symmetric with respect to the first trench electrode in a line parallel to the second direction, and wherein the drift layer of the second conductivity type, the impurity layer of the first conductivity type, and the impurity layer of the second conductivity type are disposed between the bent portion of the first trench electrode and the bent portion of the second trench electrode.

7. The semiconductor device according to claim 3, wherein the semiconductor device is an IE-type IGBT.

8. The semiconductor device according to claim 2, wherein an impurity layer of the second conductivity type is formed under the impurity layer of the first conductivity type.

9. The semiconductor device according to claim 2, wherein an impurity layer of the second conductivity type is formed to cover the impurity layer of the first conductivity type.

10. The semiconductor device according to claim 2, wherein the floating layer control gate is disposed on the impurity layer of the first conductivity type and the drift layer of the second conductivity type.

11. The semiconductor device according to claim 2, wherein the first trench electrode has a portion extending in a first direction and a bent portion extending in a second direction in a plan view, wherein the second trench electrode has a shape that is line-symmetric with respect to the first trench electrode in a line parallel to the second direction, and wherein the drift layer of the second conductivity type and the impurity layer of the first conductivity type are disposed between the bent portion of the first trench electrode and the bent portion of the second trench electrode.

12. The semiconductor device according to claim 2, wherein the semiconductor device is an IE-type IGBT.

* * * * *